(12) United States Patent
Yeh et al.

(10) Patent No.: US 10,914,805 B2
(45) Date of Patent: Feb. 9, 2021

(54) SIGNAL ERROR CALIBRATING METHOD

(71) Applicant: National Applied Research Laboratories, Hsinchu (TW)

(72) Inventors: Chih-Yuan Yeh, Hsinchu (TW); Po-Chang Wu, Hsinchu (TW); Hann-Huei Tsai, Taipei (TW); Ying-Zong Juang, Taipei (TW)

(73) Assignee: National Applied Research Laboratories, Hsinchu (TW)

( * ) Notice: Subject to any disclaimer, the term of this patent is extended or adjusted under 35 U.S.C. 154(b) by 38 days.

(21) Appl. No.: 15/954,826

(22) Filed: Apr. 17, 2018

(65) Prior Publication Data
US 2019/0271753 A1     Sep. 5, 2019

(30) Foreign Application Priority Data
Mar. 2, 2018    (TW) ............................. 107107098 A

(51) Int. Cl.
*G01R 35/00* (2006.01)
*H03M 1/00* (2006.01)

(52) U.S. Cl.
CPC .......... *G01R 35/005* (2013.01); *H03M 1/001* (2013.01)

(58) Field of Classification Search
CPC ............................. G01R 35/005; H03M 1/001
USPC .................................... 324/601; 327/20, 552
See application file for complete search history.

(56) References Cited

U.S. PATENT DOCUMENTS

| | | | | |
|---|---|---|---|---|
| 6,246,268 B1 * | 6/2001 | Cheng | ................. | H03F 3/45968 327/552 |
| 6,756,924 B2 * | 6/2004 | Lee | ..................... | H03F 3/45995 327/307 |
| 7,486,114 B2 * | 2/2009 | Chen | ................... | H04L 25/0274 327/20 |
| 8,257,565 B2 | 9/2012 | Kawase et al. | | |
| 9,449,212 B2 | 9/2016 | Riedijk | | |
| 2002/0094788 A1 * | 7/2002 | Hayashi | ................... | H04B 1/30 455/73 |

FOREIGN PATENT DOCUMENTS

| | | | | |
|---|---|---|---|---|
| DE | 10158836 A1 * | 6/2003 | .......... | G01R 33/075 |
| TW | I450175 B | 8/2014 | | |

* cited by examiner

*Primary Examiner* — Farhana A Hoque
(74) *Attorney, Agent, or Firm* — Huffman Law Group, PC

(57) ABSTRACT

A signal error calibrating method is disclosed herein and includes following steps: filtering an error voltage in a sensor by a low pass filter in a calibration mode; converting the offset voltage to be a digital offset signal by an analog digital signal converter; converting the digital offset signal to be an offset calibrating signal by a digital analog signal converter; transmitting the offset calibrating signal to an input end of the sensor so as to offset an error voltage at the input end of the sensor. After calibrating the error voltage, the analog digital converter in the error calibrating circuit can be used for the need of signal output and the low pass filter is turned off at the same time.

6 Claims, 5 Drawing Sheets

SIGNAL ERROR CALIBRATING METHOD

BACKGROUND OF THE INVENTION

1. Field of Invention

The present invention is related to a signal error calibrating method and more particularly related to a signal error calibrating method by implementing a feedback circuit.

2. Description of Prior Art

Since mobile devices, Internet of Things (TOT) and Internet of Vehicles (IOV) became more and more popular, sensors are significant components, which are configured to convert the outer signals to be electronic signals. Thereafter, the electronic signals can be executed by the circuits at the back end, as shown in FIG. 1. By the development of the technique of a semiconductor 10, the current sensor 11 can be minimized within the chip, and the sensor 11 is able to be designed with the circuits 12 together at the same substrate and the advantages thereof are small size, low power consumption and low cost. However, when the sensor 11 is minimized within the semiconductor process, the problems that the mismatch of the process and the effect of the malfunction would be occurred. There is an error existed in the sensor 11. The error and the sensing signal will be read together, so the accuracy of the overall sensing system will be decreased. When the application at the back end is more and more complicated and significant, the accuracy of the sensor is required to be more and more correct. The sensor is required to preserve at certain accuracy at different circumstances (such as different temperature or humidity).

In U.S. patent No. 20010242048A1, the capacitance structure is required to add a calibrating signal into the signal by an external detector and there is no feedback method used to input the correction. Therefore, there is no a self-correcting function. In U.S. Pat. No. 9,367,184B2, the structure implements EEPROM to store required correction values, so it is necessary to occupy extra space within the chip and the complication of the circuit is increasing. Moreover, in U.S. Pat. No. 8,242,788B2, it is required to include a set of correction data converted by the digital analog converter (DAC) to be voltage signal inputs (V1 and V2) so as to correct the error of the sensor.

Therefore, in order to satisfy the standard for the future commercial applications (such as high accuracy, low power consumption and low price), it is necessary to provide a signal error calibrating method by implementing circuit calibration structure to correct the error of the sensor in the semiconductor structure. By implementing the circuit operating structure, the cost to correct the semiconductor process of the sensor can be reduced and the accuracy of the sensor can be preserved at certain accuracy under different circumstances. Moreover, a signal error calibrating method for the sensing is provided with a simplified circuit structure to achieve the requirement of low power consumption and high accuracy.

BRIEF SUMMARY OF THE INVENTION

In order to solve the problems in the prior art, one object of the present invention is to provide a signal error calibrating method and the method is able to calibrate the error of an sensor or automatically without remarkably modifying the circuit design of the original semiconductor According to the aforementioned object, a signal error calibrating method is disclosed herein and includes the following steps:

filtering an offset voltage of a sensor by a low pass filter in a calibrating mode;

converting the offset voltage to be a digital offset signal by an analog digital converter;

converting the digital offset signal to be an offset calibrating signal by a digital analog converter;

transmitting the offset calibrating signal to an input end of the sensor to offset an error voltage at the input end of the sensor.

Another object of the present invention is to apply a feedback circuit to achieve a purpose to automatically calibrate an error of a sensing signal. By implementing the feedback circuit, the automatic calibration can be achieved, and the design of the circuit structure is simplified and the standard for low power consumption and high accuracy can be achieved.

According to the aforementioned object, a signal error calibrating method is disclosed herein and the signal error calibrating method implements an error calibrating circuit and the error calibrating circuit includes a low pass filter, an analog digital converter, an offset storage and a digital analog converter, the low pass filter is electrically connected to an output end of a sensor, the analog digital converter is electrically connected to the low pass filter, the offset storage is electrically connected to the analog digital converter, the digital analog converter is electrically connected to the offset storage, and another end of the digital analog converter is electrically connected to an input end of the sensor, the method includes following steps:

in a calibrating mode, filtering an offset voltage of a sensor by a low pass filter in a calibrating mode;

converting the offset voltage to be a digital offset signal by an analog digital converter;

converting the digital offset signal to be an offset calibrating signal by a digital analog converter;

transmitting the offset calibrating signal to an input end of the sensor to offset an error voltage at the input end of the sensor;

switching to a sensing mode from the calibrating mode when the error voltage is turned to be zero and shutting down a power of the low pass filter to save the power;

switching the analog digital converter from the error calibrating circuit to the analog sensing signal and turning off the low pass filter so as to reduce power consumption.

The signal error calibrating method in the present invention is implemented to calibrate the error of the sensor in the semiconductor process. In accordance with the operation mechanism of the circuit, the process cost of the sensor for the calibration can be reduced and the certain accuracy of the sensor can be maintained at different circumstances.

DETAILED DESCRIPTION OF THE PREFERRED EMBODIMENTS

These and other aspects of the embodiments herein will be better appreciated and understood when considered in conjunction with the following description and the accompanying drawings.

Figure 1:
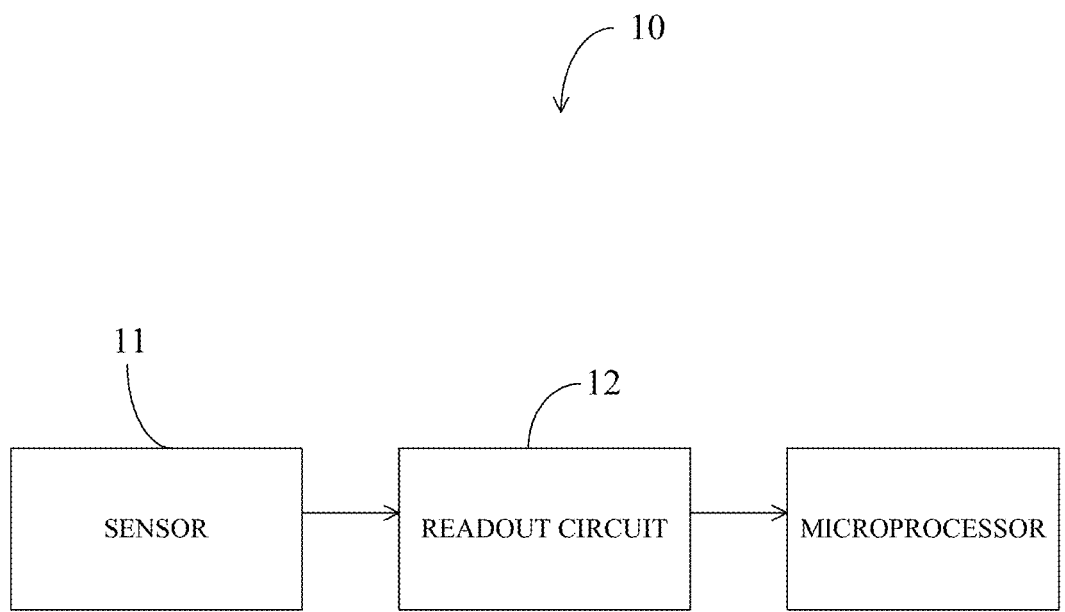
FIG. 1 is a block diagram of a conventional sensor.
Figure 2:
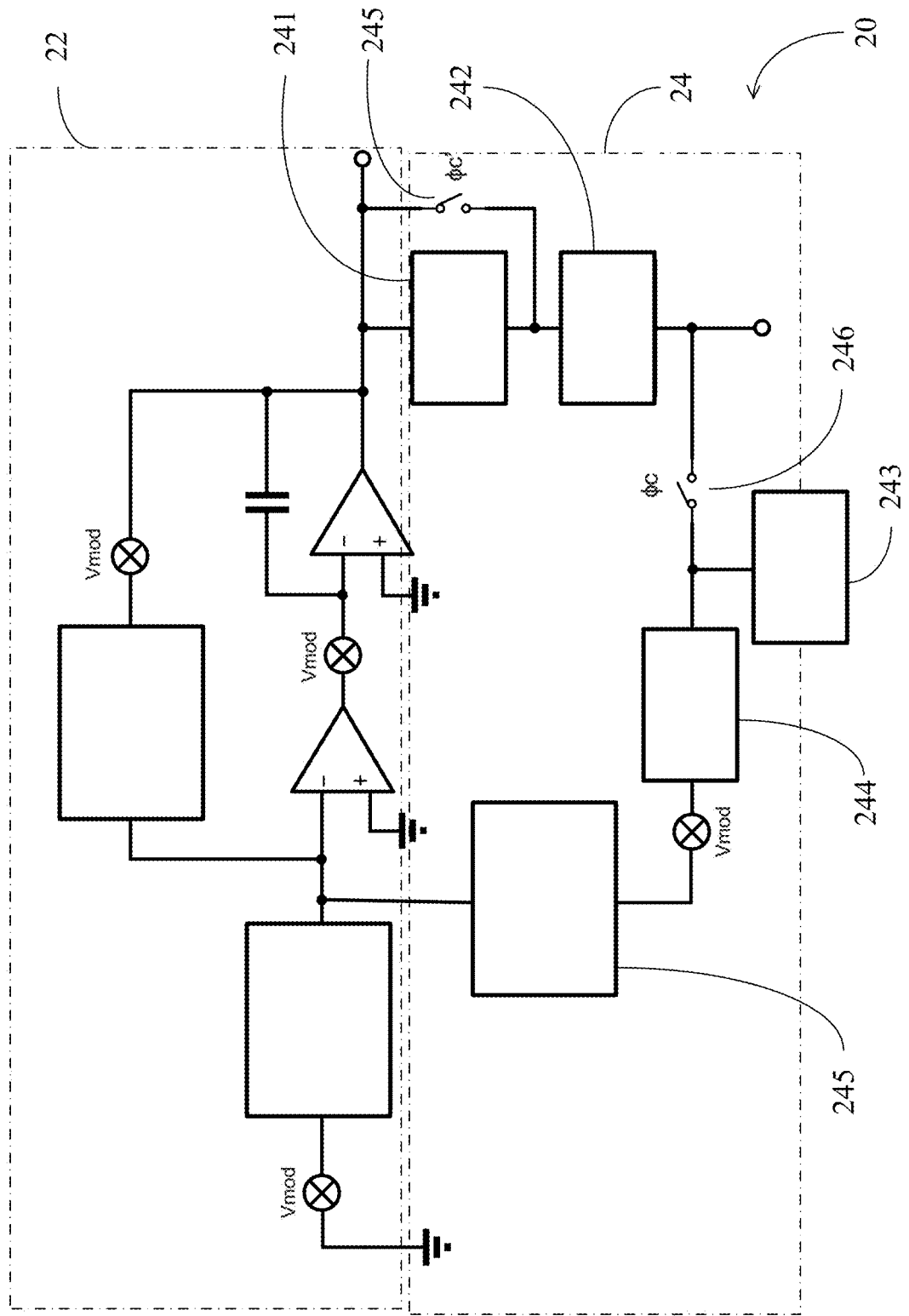
FIG. 2 is a circuit diagram of a signal error calibrating system in the present invention.

FIG. 2 is a circuit diagram of a signal error calibrating system in the present invention. As shown in FIG. 2, the signal error calibrating system 20 includes a sensor 22 and an error calibrating circuit 24. The sensor 22 could be a resistance sensor, a capacitance sensor or an inductance sensor, and it is not limited herein. Since the circuit structure of the sensor 22 is well known for the person with ordinary skill in the art, the detail description for the components and the connection relationship of the sensor 24 is omitted herein.

The error calibrating circuit 24 includes a low pass filter 241, an analog digital converter 242, an offset storage 243 and a digital analog converter 244. The low pass filter 241 is electrically connected to an output end 221 of the sensor. The analog digital converter 242 is electrically connected to the low pass filter 241. The offset storage 243 is electrically connected to the analog digital converter 242. The digital analog converter 244 is electrically connected to the offset storage 243 and another end of the digital analog converter 244 is connected to an output end 222 of the sensor 22.

In addition, the error calibrating circuit 24 further includes a first switch 245 and a second switch 246. When the error calibrating circuit 24 is in a sensing mode, the first switch 245 is ON and the second switch 246 is OFF. When the error calibrating circuit 24 is in a calibrating mode, the first switch 245 is OFF and the second switch 246 is ON.

When the error at the output of the sensor 22 is existed, an error voltage with non-zero voltage value is generated at the output end 224 of the sensor 22 and the error calibrating circuit 24 is in the calibrating mode. The first switch 245 is OFF and the second switch 246 is ON. The error voltage with non-zero voltage value is implemented to be an offset voltage. The offset voltage is filtered by the low pass filter 241 and transmitted to the analog digital converter 242. Then, the offset voltage is converted to be a digital offset signal and saved in the offset storage 243. The offset storage 243 can be made of capacitance array or read access memory (RAM), but it is not limited herein. In the calibration mode, the analog digital converter 242 converts the offset voltage of the sensor 22 to be a digital value and the digital data is saved in the offset storage 242. In the normal operating mode (the sensing mode), the analog digital converter 242 and the offset storage 243 are cut off, and the digital value in the offset storage 243 will be converted by the digital analog converter 244 to be the calibrating voltage so as to perform an error calibrating operation for the sensor 22.

Thereafter, the digital offset signal is converted to be the analog signal and the analog signal will be transmitted to the input end 224 of the sensor 22. The digital offset signal and the input error voltage of the sensor 22 are offset to each other. The aforementioned calibrating steps are repeated until the error voltage at the output end is zero, and the operations in the calibrating mode are ended. Then, the clock (ΦC) controls the error calibrating circuit 24 to switch from the calibrating mode to the sensing mode. The first switch 245 is ON and the second switch 246 is OFF, and the power in the low pass filter 241 is shut down. The analog sensing signal is directly transmitted to the analog digital converter 242 instead of the offset storage 243 and the digital analog converter 244.

Figure 3:
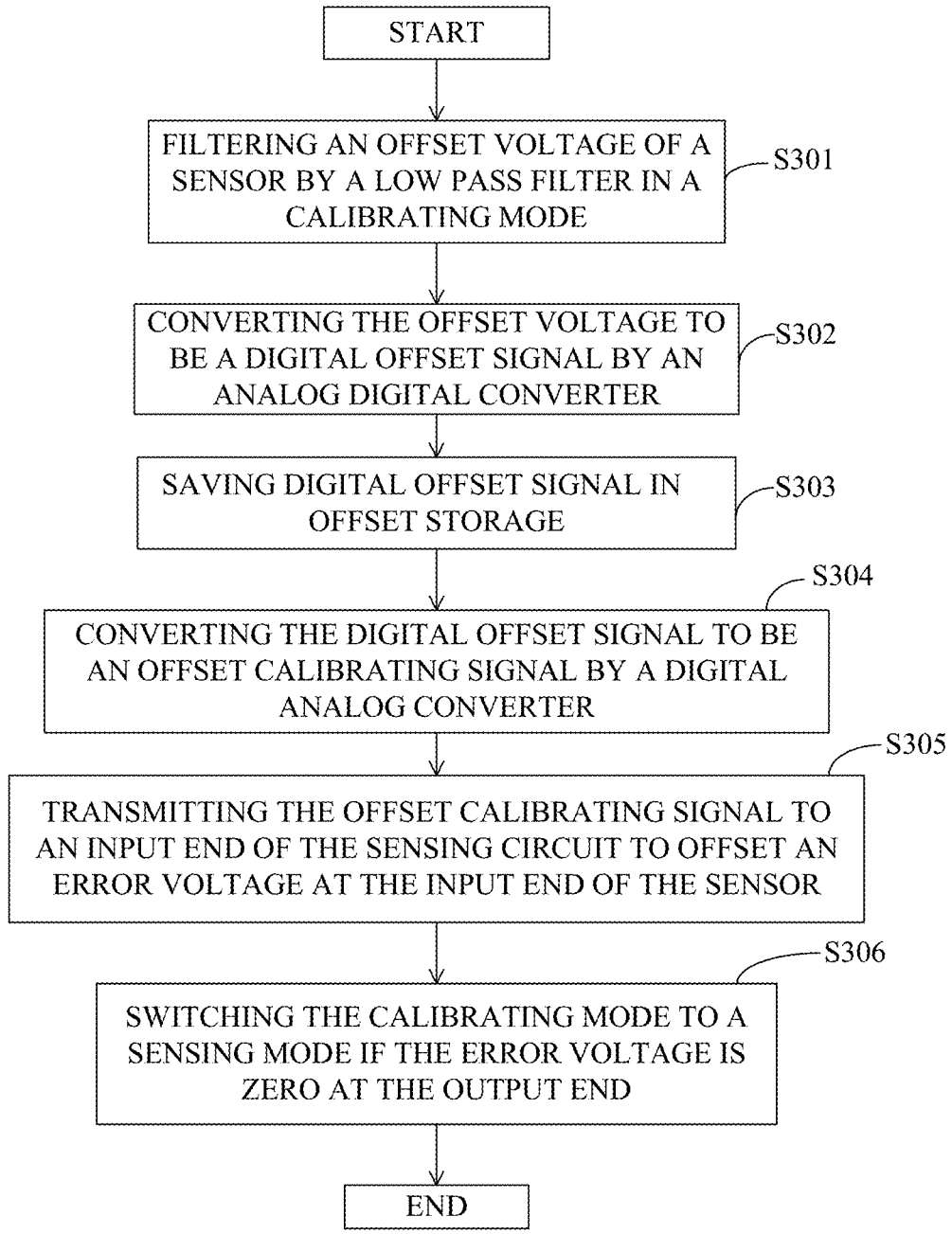
FIG. 3 is a flow char of a signal error calibrating method in the present invention.

FIG. 3 is a flow char of a signal error calibrating method in the present invention. The signal error calibrating method in the present invention is preferred to be applied in the aforementioned signal error calibrating system, but it is not limited herein. As shown in FIG. 3, in step S301, in the calibrating mode, the offset voltage is filtered by a low pass filter. In step S302, the offset voltage is converted to be a digital offset signal by an analog digital converter. In step S303, the digital offset signal is saved in an offset storage. In step S304, the digital offset signal is converted to be an offset calibrating signal by the digital analog converter. In step S305, the offset calibrating signal is transmitted to an input end of the sensor to offset the error voltage in the input end of the sensor. In step S306, when the error voltage is turned to be zero, the calibrating mode is switched to be the sensing mode. The error signal calibrating method in the present invention includes some advantages, such as simplified circuit design and low power consumption. In addition, the clock can be used to control switches to perform calibration at any time in accordance with the variation (for example temperature variation and so on) of the error of the sensor. In the sensing mode, the analog digital converter in the error calibrating circuit is switched to be used for the analog sensing signal and the power for the low pass filter is shut down so as to reduce power consumption.

When the signal error calibrating method in the present invention is applied in the sensor, the amplifying circuit with modulation mechanism and the feedback error voltage cancellation path (having low pass filter, ADC, DAC, clock control and offset storage) are included. The mechanism of the clock control (DC) is used to perform an error calibration and turned off the low pass filter. The signal error calibrating method in the present invention includes an automatic calibrating function without adding any external calibrating signals. The error calibrating circuit can be applied in any kinds of sensors, such as a pressure gauge, a microphone, an accelerometer or a gyroscope. It is only necessary to replace the passive components of the feedback network in accordance with the circuit equivalent model of the sensor. The fully differential output or signal ended output circuit architecture can be achieved.

Figure 4:
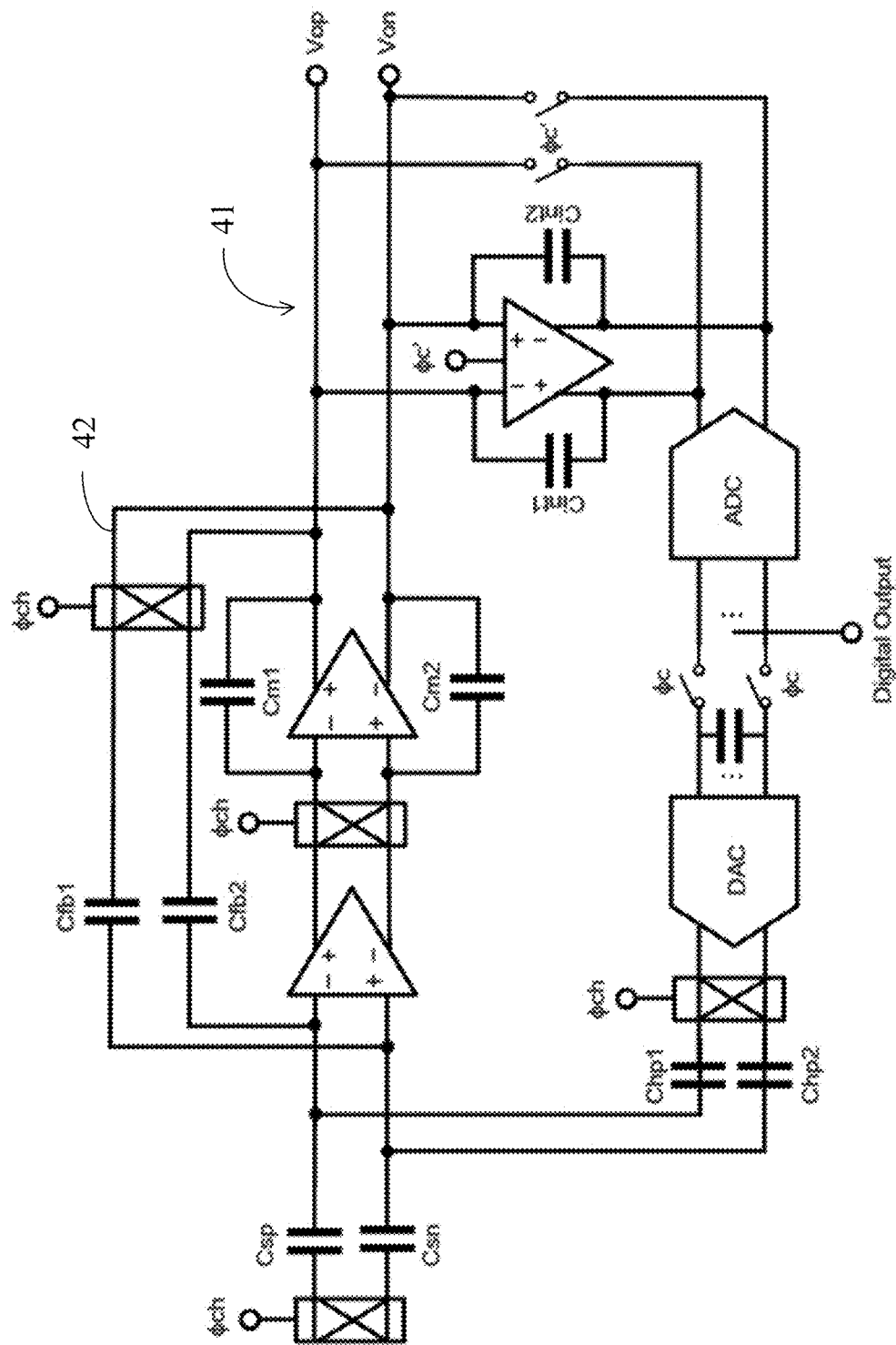
FIG. 4 is a circuit diagram of an accelerometer applying signal error correction method in the present invention.
Figure 5:
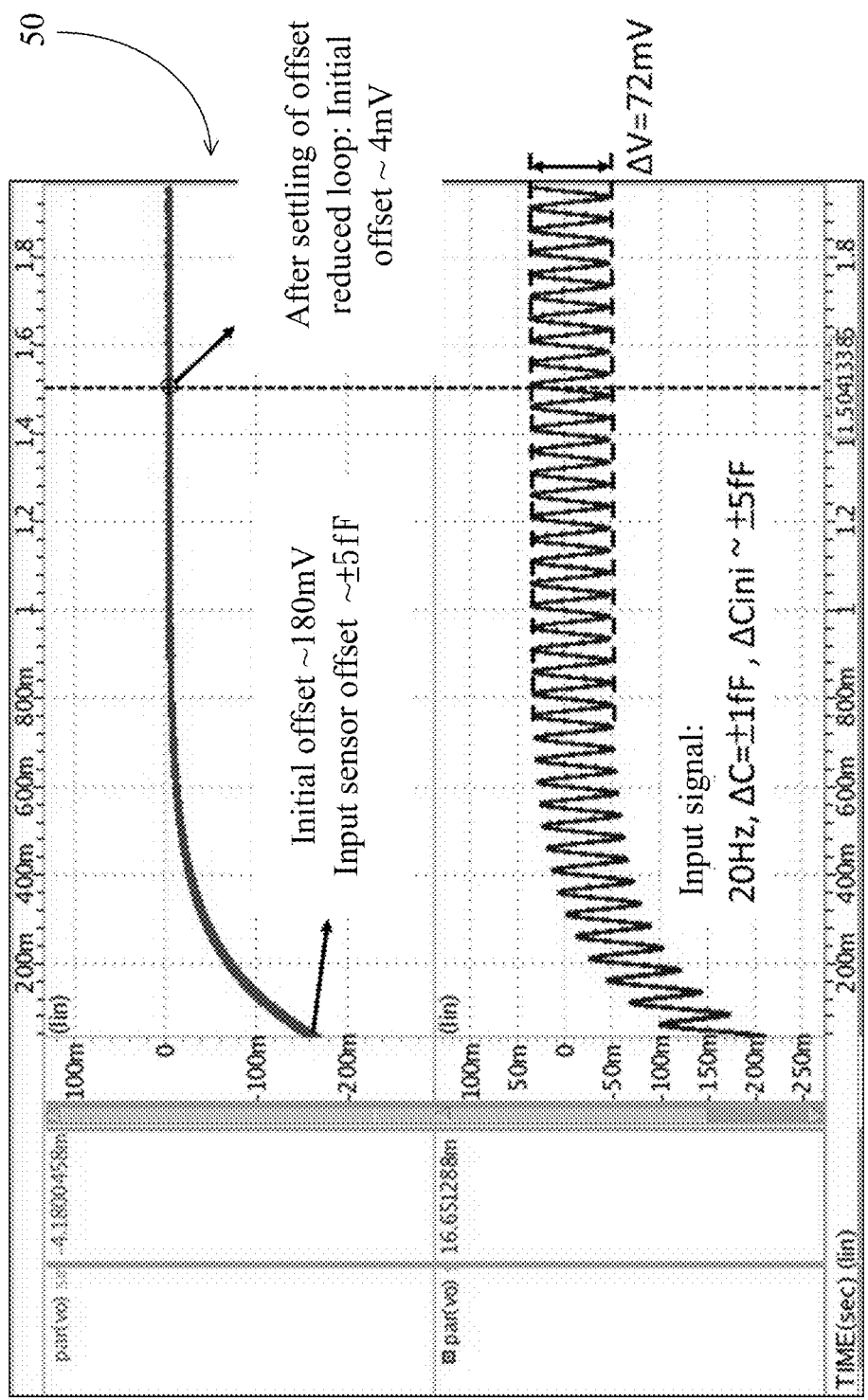
FIG. 5 is a signal simulation result view of an accelerator by using the signal error calibrating method in the present invention.

FIG. 4 is a circuit diagram of an accelerometer applying signal error correction method in the present invention. As shown in FIG. 4, the capacitance sensor 42 is applied to the accelerometer 41. The signal error calibrating method in the present invention can suppress the error of in the capacitance sensor 42 efficiently. The simulation results 50 thereof is shown in FIG. 5, the error can be effectively corrected to 0 error when the capacitance sensor 42 is in sensing or stationary process.

Although the present invention has been disclosed as preferred embodiments, the foregoing preferred embodiments are not intended to limit the present invention. Those of ordinary skill in the art, without departing from the spirit and scope of the present invention, can make various modifications and variations to the present invention. Therefore, the scope of the claims of the present invention must be defined.

What is claimed is:

1. A signal error calibrating method comprising steps:
    turning off a first switch and turning on a second switch in a calibrating mode;
    filtering an offset voltage of a sensor by a low pass filter in the calibrating mode;
    converting the offset voltage to be a digital offset signal by an analog digital converter;
    storing the digital offset signal in an offset storage;

converting the digital offset signal to be an offset calibrating signal by a digital analog converter;

transmitting the offset calibrating signal to an input end of the sensor to offset an error voltage at the input end of the sensor; and switching the calibrating mode to a sensing mode if the error voltage is zero at the output end after the step of offsetting the error voltage at the input end of the sensor.

2. The signal error calibrating method according to claim 1, wherein the sensor is selected from the group consisting of a capacitance sensor, a resistance sensor or an inductance sensor.

3. The signal error calibrating method according to claim 1, wherein the analog digital converter converts an output voltage to be a digital output signal at the sensing mode.

4. A signal error calibrating method, wherein the signal error calibrating method implements an error calibrating circuit and the error calibrating circuit including a low pass filter, an analog digital converter, an offset storage and a digital analog converter, the low pass filter electrically connected to an output end of a sensor, the analog digital converter electrically connected to the low pass filter, the offset storage electrically connected to the analog digital converter, the digital analog converter electrically connected to the offset storage, and another end of the digital analog converter electrically connected to an input end of the sensor, the method comprising steps:

turning off a first switch and turning on a second switch in a calibrating mode and filtering an offset voltage of a sensor by a low pass filter in the calibrating mode;

converting the offset voltage to be a digital offset signal by an analog digital converter;

converting the digital offset signal to be an offset calibrating signal by a digital analog converter;

transmitting the offset calibrating signal to an input end of the sensor to offset an error voltage at the input end of the sensor; and switching to a sensing mode from the calibrating mode when the error voltage is turned to be zero.

5. The signal error calibrating method according to claim 4, wherein the sensor is selected from the group consisting of a capacitance sensor, a resistance sensor or an inductance sensor.

6. The signal error calibrating method according to claim 4, wherein the analog digital converter converts an output voltage to be a digital output signal at the sensing mode, and a power for the low pass filter is shut down.

* * * * *